United States Patent [19]
Kahn et al.

[11] Patent Number: 5,325,011
[45] Date of Patent: Jun. 28, 1994

[54] TRANSDUCERS AND METHOD FOR MAKING SAME

[75] Inventors: Manfred Kahn, Alexandria; Chulho Kim, Burke, both of Va.

[73] Assignee: The United States of America as represented by the asecretary of the Navy, Washington, D.C.

[21] Appl. No.: 76,135

[22] Filed: Jun. 9, 1993

[51] Int. Cl.$^5$ .................. H01L 41/08; H01L 41/187
[52] U.S. Cl. ...................................... 310/358; 310/328
[58] Field of Search ................ 310/357, 358, 323, 328

[56] References Cited

U.S. PATENT DOCUMENTS

| | | | |
|---|---|---|---|
| 4,321,418 | 3/1982 | Dran et al. | 136/251 |
| 4,412,148 | 10/1983 | Klicker et al. | 310/358 |
| 4,422,003 | 12/1983 | Safari et al. | 310/358 |
| 4,613,784 | 9/1986 | Haun et al. | 310/358 |
| 4,728,845 | 3/1988 | Haun et al. | 310/358 |
| 4,788,096 | 11/1988 | Kalnin et al. | 428/188 |
| 4,876,776 | 10/1989 | Whatmore et al. | 29/25.35 |
| 4,963,782 | 10/1990 | Bui et al. | 310/358 |
| 5,016,023 | 5/1991 | Chan et al. | 346/1.1 |
| 5,065,068 | 11/1991 | Oakley | 310/357 |

FOREIGN PATENT DOCUMENTS 0009580 1/1991 Japan .................................. 310/328

Primary Examiner—Thomas M. Dougherty
Attorney, Agent, or Firm—Thomas E. McDonnell; George A. Kap

[57] ABSTRACT

Elongated electrically nonconducting transducer preforms are made from a stiff resin. The preforms have grooves in their upper and lower surfaces. Transducer elements may be formed from stacked preforms whereby grooves in their upper and lower surfaces form compartments between adjoining stacked preforms. PZT rods are disposed in the grooves disposed on the upper surface of each stacked preform, and a soft resin surrrounds the rods and fills the compartment. The method for making the transducer assembly includes the steps of loading by gravity the rods into the upper grooves of the preforms; stacking the loaded preforms so that upper grooves in the lower preform communicate with lower grooves in the upper preform, thus forming cavities; flowing a soft resin around the rods; and curing the soft resin.

8 Claims, 3 Drawing Sheets

TRANSDUCERS AND METHOD FOR MAKING SAME

FIELD OF INVENTION

This invention pertains generally to transducers and more particularly to transducers which convert hydrostatic or acoustic pressure into electrical signals.

BACKGROUND OF INVENTION

Known transducers have a plurality of spaced, parallel transducer rods embedded in a rigid resin between a pair of spaced conducting planes disposed transversely to the rods. The resin transmits hydrostatic pressure fluctuations to the sides of the rods. For this reason, the known transducers referred to above transmit the lateral component of hydrostatic pressure fluctuations to the transducer rods. This transmission reduces the hydrostatic pressure sensitivity and, when a rigid resin is used, longitudinal expansion of the rods, as one would expect when applying a voltage to the rod ends, is clamped and impeded.

In order to attenuate lateral acoustic pressure fluctuations, the prior art has developed transducers wherein each of the longitudinal transducer rods are surrounded by a cylinder of air and disposed in a matrix of a rigid synthetic resin between a pair of spaced and parallel conducting plates. This transducer design is disclosed in the article entitled "An Optimization of 1.3.1 PZT-Polymer Composite For Deep Underwater Hydrophone Application" by C. Richard, P. Eyraud, L. Eyraud, and D. Audigier, which article was presented at the 8th International Symposium on Application of Ferroelectrics in Greenville, N.C., on Sep. 2, 1992.

Transducers which have air around the transducer rods have a number of disadvantages. Such transducers do not provide lateral support to the rods and under high pressures, such as about 3000 psi or about 200 kg/cm$^2$, the transducer rods can dislocate sideways, rendering the transducer useless.

The transducers noted in the previous paragraph are assembled in accordance with a costly and time-consuming procedure. This assembly procedure involves preparing a solid polymer matrix of a certain thickness with a plurality of spaced cylindrical openings or wells larger in diameter that the transducer rods but corresponding to the desired spacing and location of the rods. The openings of desired size in the polymer matrix can be drilled and the conductive armature plates are cut from sheet metal. The transducer rods are positioned in a predetermined arrangement on a conducting armature plate and bonded thereto with a conducting adhesive. Then the polymer matrix is positioned on the conducting armature plate and secured to the plate with a suitable adhesive. In such a configuration, the transducer rods are disposed in the wells of the polymer matrix, with the rods and the matrix secured to the underlying conducting armature plate. Another conducting plate is then bonded to the upper level of the rods and the polymer matrix. The rods can be ground so that the rods and the polymer matrix are in the same horizontal plane.

The prior art assembly procedure is characterized by manual assembly steps which require attention to detail and exercise of individual judgement in assembling a transducer from its component parts.

SUMMARY OF INVENTION

An object of this invention is a transducer preform which has grooves therein for accommodating transducer rods.

Another object of this invention is a transducer having an improved hydrostatic response.

Another object of this invention is a transducer which attenuates the effects of the lateral component of the hydrostatic pressure fluctuations.

Another object of this invention is an automatable procedure for assembling a transducer.

Another object of this invention is an assembly procedure which can position transducer rods in suitably prepared transducer preforms quicker, more predictably and more uniformly than prior art assembly procedure.

These and other objects of this invention are accomplished by the transducer of this invention and method for making same. In the transducers of this invention, transducer rods are disposed in a plurality of stacked preforms. These preforms contain grooves and the rods are embedded in a soft synthetic resin in the grooves. This soft resin holds the rods in place in the grooves, reduces the lateral pressure fluctuations exerted on the rods, and allows the rods to expand longitudinally when a voltage is applied to their ends. The method for making the transducer of this invention includes the steps of automatically positioning transducer rods in the grooves of transducer preforms to form loaded preforms, the preforms having spaced grooves in upper and lower surfaces; assembling a plurality of the preforms whereby grooves in the upper surface cooperate with the grooves in the lower surface to form cavities; and depositing a soft resin in the cavities around the transducer rods.

DETAILED DESCRIPTION OF INVENTION

Figure 1:
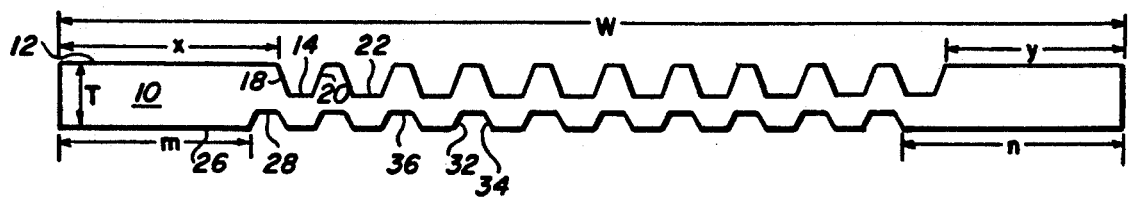
FIG. 1 is a cross-sectional view of an intermediate preform which is the preferred embodiment of this invention.

The transducer of this invention is intended for use as a receiver or as a driver in the frequency range from about 1 Hz to about 10,000 Hz, especially as a receiver of underwater sound signals to sense the presence of another vessel or of an echo. These functions can be carried out in the frequency range of about 10–200 Hz.

The transducer of this invention is made by an assembly procedure which utilizes automatic loading of the transducer rods into transducer preforms.

The transducers of this invention are composed of preforms having upper and lower grooves, transducer rods in the upper grooves, and a soft resin disposed around each rod which, in conjunction with the hard preforms, attenuates lateral hydrostatic pressure fluctuations. The preforms are corrugated and are made from a thermoplastic, hard, rigid resin that has a modulus of elasticity of 300 to 50,000 MPa, preferably 500 to 20,000 MPa. In a preferred embodiment, the preforms are made from a stiff polymer, such as a polyphthalamide or a polycarbonate resin, by injection molding, with or without stiff fiber reinforcement. Preforms can also be made from other plastic materials.

The dimensions of a preform are dictated, inter alia, by the number of transducer rods the preform is to accommodate and the stiffness of the resin from which it is made. Preforms made from very stiff resin can be used to accommodate more rods. Therefore, each preform is preferably about 0.1 to about 100 cm in width, and more preferably about 0.5 to about 25 cm; its length is preferably about 0.01 to about 50 cm, and more preferably about 0.05 to about 20 cm; and its thickness is preferably about 0.01 to about 2 cm, and more preferably about 0.05 to about 0.5 cm. The width of the preforms is identified by letter W in FIG. 1, thickness by letter T, and length is the transverse dimension of the preforms.

The preforms are arranged or stacked one on top of another with the upper grooves in the lower preform cooperating with the lower grooves in the upper preform so that compartments are formed for the soft resin and the transducer rods. The number of stacked preforms in a transducer typically varies from about 3 to about 500, preferably about 5 to about 100.

Each preform made from a stiff resin is an elongated element with side walls defining each upper and lower groove which extends along the length of each preform. More specifically, in the upper surface of each preform is a plurality of spaced upper grooves. Typically, the upper grooves are equally spaced. These upper grooves are elongated depressions in the preform with each groove defined by lateral confining side walls and a base. The side walls can be inclined or vertical. The grooves may be of a depth of, for example, up to about one-half the preform thickness. The actual depth of the upper grooves depends on the diameter of the transducer rods disposed within these grooves. The inclined side walls tend to cause an applied force along the width of the preform to increase the overall thickness of the preform whereas vertical side walls cause such an increase in thickness. The inclined or diverging side walls are therefore preferred because they maximize hydrostatic response.

The base width, i.e., the width of each upper groove as measured at the base thereof, is typicallly about 0.005 to about 1 cm, preferably about 0.01 to about 0.5 cm. The opening width i.e., the width of each upper groove along the horizontal plane defined by upper surface of the preform, is typically about 0.01 to about 2 cm, preferably about 0.02 to about 1 cm. The dimensions of the upper grooves should be such that transducer rods can be automatically placed therein. The depth of the upper grooves is typically about 0.005 to about 1 cm, preferably about 0.01 to about 0.5 cm. Each preform typically has from about 2 to about 500 upper grooves, preferably about 5 to about 100.

At the lower surface of each preform is a plurality of spaced lower grooves. These lower grooves are typically equally spaced. Each lower groove is defined by lateral side walls and a base. Side walls can be inclined or vertical and they extend from the lower surface of each preform into the preform itself. Inclined side walls facilitate expansion of the thickness of the preform from the lengthwise applied force, and are, therefore, preferred. The opening width, i.e., the width of each lower groove measured at the mouth thereof or along a line extending from the lower surface, is typically about 0.01 to about 2 cm, preferably about 0.02 to about 0.5 cm. The base width, i.e., the width at the base of the lower grooves, is typically about 0.001 to about 1 cm, preferably about 0.01 to about 0.5 cm. The depth of the lower grooves is typically from about 0.001 to 0.5 cm, preferably from about 0.01 to 0.2 cm. Each preform typically has from about 2 to about 500 lower grooves, preferably about 5 to about 100.

The horizontal distance from the left extremity of the preform shown in FIG. 1 measured along the upper surface thereof to the outer edge of the first upper groove is typically about 0.05 to about 5 cm, and preferably about 0.1 to about 3 cm. The corresponding horizontal distance at the right extremity of the preform is also typically about 0.05 to about 5 cm, and preferably about 0.1 to about 3 cm.

The horizontal distance from the left extremity of the preform measured along lower surface of the preform to the outer edge of the first lower groove, i.e., dimension m in FIG. 1, is typically about 0.05 to about 5 cm, and preferably about 0.1 to about 3 cm, whereas the horizontal distance from the right extremity of the preform measured along the lower surface to the outer edge of the first or closest lower groove going to the left, i.e., dimension n in FIG. 1, is typically about 0.05 to about 5 cm, preferably about 0.1 to about 3 cm.

The grooves extending from the upper surface and from the lower surface of each preform are preferably evenly spaced along the horizontal extent although they can be spaced in any manner desired. The grooves at the upper surface of a preform are staggered with respect to the grooves in the lower surface. In a preferred embodiment, there is at the right extremity of each preform, an upper groove at each end as well as a plurality of the evenly spaced upper grooves intermediate of the opposite ends of the preform. At the lower surface of the preform, there are lower grooves at each end of the preform and a plurality of evenly spaced lower grooves intermediate the opposite ends.

All intermediate preforms in a transduser are preferably identical except that alternate intermediate preforms are turned 180° about the vertical axis from the other intermediate preforms. The top preform of a transducer is of preferably similar thickness and more preferably of the same thickness as the intermediate preforms but with an an upper flat surface which is devoid of upper grooves and has only a plurality of spaced lower grooves along its lower surface. The lower grooves in the top preform typically have about the same dimensions as in the intermediate preforms, although they can have other dimensions. The bottom preform of a transducer is of preferably similar thickness and more preferably of the same thickness as the intermediate preforms but with a flat lower surface which is devoid of lower grooves and has only a plurality of spaced upper grooves along its upper surface. The upper grooves in the bottom preform typically have about the same dimensions as in the intermediate preforms, although they can have other dimensions.

The grooves in the preforms are adapted to cooperate with the grooves in the adjacent surface of the neighboring preform to support transducer rods. The intermediate preforms have both upper and lower grooves. The transducer rods are disposed in the upper grooves of the intermediate preforms and in the upper grooves of the bottom preform.

Preferably, the transducer rods are circumferentially surrounded with and embedded in a soft synthetic resin. The transducer rods are typically circular in cross-section although other shapes can be used. In a preferred embodiment, the transducer rods are circular in cross-section with a diameter of about 0.005 to about 1 cm, preferably about 0.01 to about 0.5 cm. If the rods are too thick, the hydrostatic response is reduced. If the rods are too thin, they are difficult to manufacture and may break readily. The length of the transducer rods depends on the desired characteristics. The transducer rods will have the same length as, or be slightly longer than, the length of the preforms. If the rods are longer than the preforms, they may be extended about 0.1 to about 1 mm in order to support a stress amplification plate so that the output signals can be amplified. The rods are adapted to rest in the upper grooves of the preforms. The length of the transducer rods is typically about 0.01 to about 5 cm, preferably about 0.05 to about 1 cm. If the rods are too long, the assembly will become massive and if the rods are too short, inadequate electrical signals will be generated.

The transducer rods are made from a suitable sintered piezoelectric ceramic or electrostrictive material. This is typically PZT (lead-zirconium-titanate) or any other stiff piezoelectric or electrostrictive material having a strain coefficient of at least about $10 \times 10^{-12}$ m/volt. Piezoceramic and electrostrictive materials are commercially available. In a preferred embodiment, the transducer rods are made from PZT material.

The method of forming the transducer rods is not critical. The transducer rods may be formed by any method in the art suitable for making ceramic rods.

Similarly, the method of poling transducer rods used in the present invention is not critical. Thus, any technique suitable for poling piezoelectric ceramics may be used.

Figure 5:
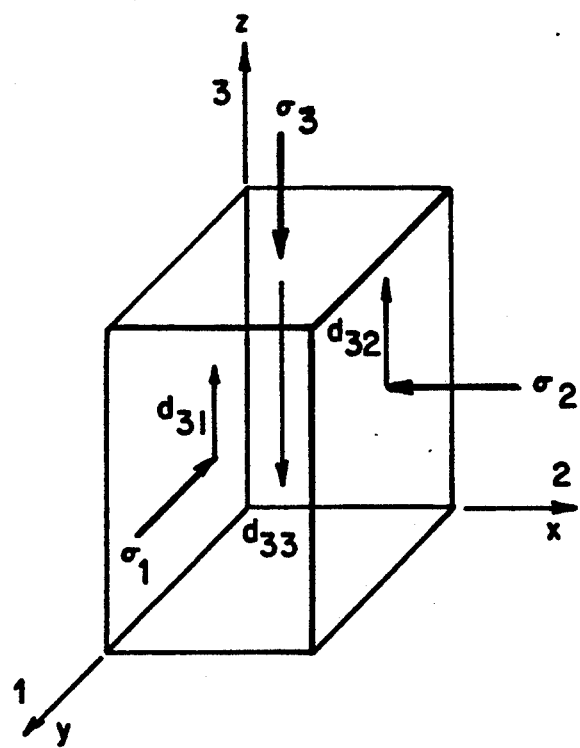
FIG. 5 is a schematic illustration of the three directions of the forces in a solid material caused by an applied hydrostatic pressure.

The resin surrounding the transducer rods should be soft in its cured or set form so that, together with the stiff preforms, it can reduce the lateral effects of hydrostatic pressure fluctuations exerted on the transducer of this invention. The modulus of elasticity of these soft resins is typically from about 0.1 to about 300 MPa and preferably in the range of about 0.5 to about 10 MPa. In a more preferred embodiment, the soft resin is a soft epoxy such as RHO-C 35065 of The B. F. Goodrich Company, Conathane EN-2 of Conap Incorporated, HD-50 of FMI Corporation, HD-68 of FMI Corporation, or HD-77 of FMI Corporation, all of which are available commercially. The soft resin around the transducer rods, in conjunction with the stiff preforms, improves the hydrostatic response of the transducers. This behavior is apparent from Equation 1, below, which illustrates the relationship between the hydrostatic charge coefficient $d_h$ and the charge on the ends of the rod due to the stress component $\sigma_1$ ($d_{31}$), the charge on the rods due to the stress component $\sigma_2$ ($d_{32}$), and the charge on the rods due to the stress component $\sigma_3$, ($d_{33}$). The quantity identified by letter "d" denotes piezoelectric charge coefficient, which is an indication of amount of charge generated per unit of applied force. In the quantity $d_{31}$, the first digit "3" of the subscript denotes the direction in which the charge is displaced and the second digit "1" denotes direction of applied force. As viewed in FIG. 5, the arrow designated by numeral "1" denotes the Y direction, the arrow designated by numeral "2" denotes the X direction, and the arrow designated by numeral "3" denotes the Z direction. The hydrostatic charge coefficient $d_h$ can then be calculated from the following relationship:

$$d_h = d_{33} + d_{32} + d_{31} \qquad \text{(Equation 1)}$$

Because of the sign of the Poisson's effect, the values $d_{32}$ and $d_{31}$ are negative values. Thus, compression in the X-Y plane produces expansion in the Z direction. Embodiments according to the present invention can achieve a $d_h$ in the range of about 80–750, generally in the range of 100 to 400.

The ratio of the volume of the piezoelectric transducer rods, to that of the soft resin coating material, and to that of the hard resin matrix or preform material, should be selected to benefit from the advantage provided by the soft coating around the transducer rods. The volume percent in a transducer assembly of the piezoelectric ceramic is typically from about 5% to about 30% and preferably in the approximate range of about 10–20%; the amount of the soft resin is typically from about 5% to about 65% and preferably in the approximate range of 10–50%. The remainder is the hard, stiff resin matrix from which the preforms are made.

A plurality of transducer elements can be combined with a nonconductive adhesive to form a transducer array of desired size. Electrodes on the ends of the rods made of conductive epoxy, silver paste, or evaporated metal, are necessary for proper operation. The surfaces of the rods should be flattened by grinding. Such an array is then provided with conducting plates on the face and back sides thereof and the resulting transducer assembly can be mounted on the hull of a vessel, with provision being made for waterproofing the assembly. An electrical lead, or several of such leads, can be attached to each conducting surface to provide a driving voltage in a transmitting mode or to receive signals from the transducer array which are then processed in a known way.

If enough of the transducer elements are combined to provide a transducer array which is longer than the wavelength of the hydrostatic pressure fluctuation, it becomes possible to not only detect the intensity of a signal resulting from the hydrostatic pressure fluctuation, but to also determine the direction along which the source of such a signal lies. Assuming an operating frequency of 100 Hz, the wavelength of a hydrostatic pressure fluctuation in water would be about 4 meters. In order to determine the direction from which the wave originated, the length of the transducer array should be at least as long as one-half of the wave.

So far, the discussion has been centered on a transducer array wherein a plurality of transducer elements are combined to form a single level transducer array. Transducer elements can also be stacked vertically to produce multilevel transducer arrays. This vertical stacking can increase output voltage.

A pressure amplification plate is a high stiffness conducting plate. It can increase sensitivity of a transducer element. By using such plates over the ends of the rods, which plates have protrusions or other means adapted to contact the ends of the rods only, one can increase the pressure applied to the transducer rods.

Referring now to FIG. 1, which illustrates a specific preferred preform according to the present invention, the width of the preform is denoted by letter W, the thickness is denoted by letter T, and the length is the transverse dimension, which is not shown. In this specific embodiment, the intermediate preform 10 is 2.5 cm in width, has a thickness of 0.16 cm and a length of 0.5 cm. In the upper surface 12 of preform 10 are a plurality of equally spaced upper grooves 14 defined by laterally inclined sidewalls 18, 20 and bases 22. The base width of each upper groove 14, as measured along base 22, is 0.08 cm and the opening width of each upper groove 14 at the upper surface 12 of preform 10 is 0.14 cm. The depth of each upper groove 14 is 0.08 cm. At the lower surface 26 of preform 10 are a plurality of equally spaced lower grooves 28 defined by lateral sidewalls 32, 34 and upper wall 36. The opening width of each lower groove measured at the mouth thereof, at lower surface 26, is 0.10 cm. The width of base 36 is 0.06 cm. The depth of each lower groove 28 is 0.04 cm.

The horizontal distance x from the left extremity of the preform, as shown in FIG. 1, measured along upper surface 12 to the outer edge of the first upper groove 14 is 0.54 cm and the corresponding distance y at the right extremity is 0.45 cm.

The horizontal distance m from the left extremity of the preform, as shown in FIG. 1, measured along lower surface 26 of the preform to the outer edge of the first lower groove 28 is 0.47 cm whereas the corresponding distance n on the right side of the preform is 0.56 cm.

As shown in FIG. 1, the lower groove 28 at the left extremity of the preform is staggered with respect to upper groove 14, with the lower groove 28 being to the left of the upper groove. Since the first groove at the upper surface 12 at the left extremity of the preform is staggered to the right with respect to the first lower groove 28, the converse is true at the right extremity of the preform shown in FIG. 1.

Figure 2:
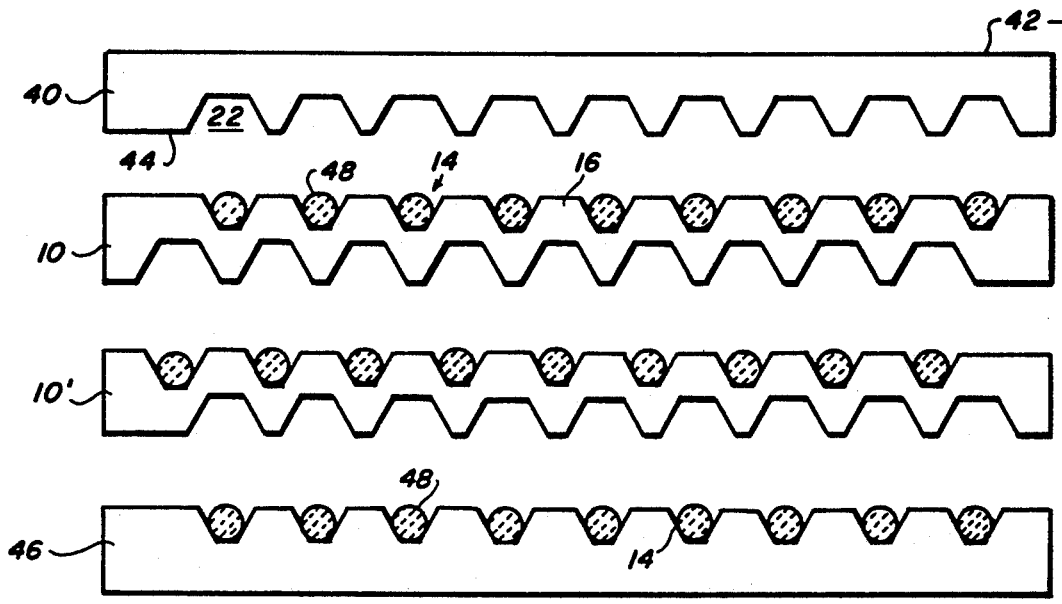
FIG. 2 is a cross-sectional view of a top preform, of two intermediate preforms, and of a bottom preform, of a preferred embodiment of this invention, showing the disposition of the ceramic transducer rods in the preforms.

FIG. 2 illustrates an exploded cross-sectional view of a transducer assembly according to the present invention. The assembly includes top preform 40, two intermediate preforms 10 and 10', and bottom preform 46. Intermediate preforms 10 and 10' are identical. Intermediate preforms 10' are rotated about a vertical axis 180° with respect to intermediate preform 10. The top preform 40 is similar and preferably of the same thickness as the intermediate preforms but has an upper surface 42 devoid of upper grooves and, in the embodiment of FIG. 2, is flat. Top preform 40 has a plurality of spaced lower grooves 28 along its lower surface 44. The lower grooves 28 in the top preform have the same dimensions as do the lower grooves 28 in the intermediate preforms.

The bottom preform 46 in FIG. 2 is adapted to support transducer rods 48 in upper grooves 14. The upper grooves in the bottom preform have the same dimensions as do upper grooves 14 in the intermediate preform shown in FIG. 1. The lower surface of the bottom preform is devoid of grooves and, in the embodiment shown, is flat.

Figure 3:
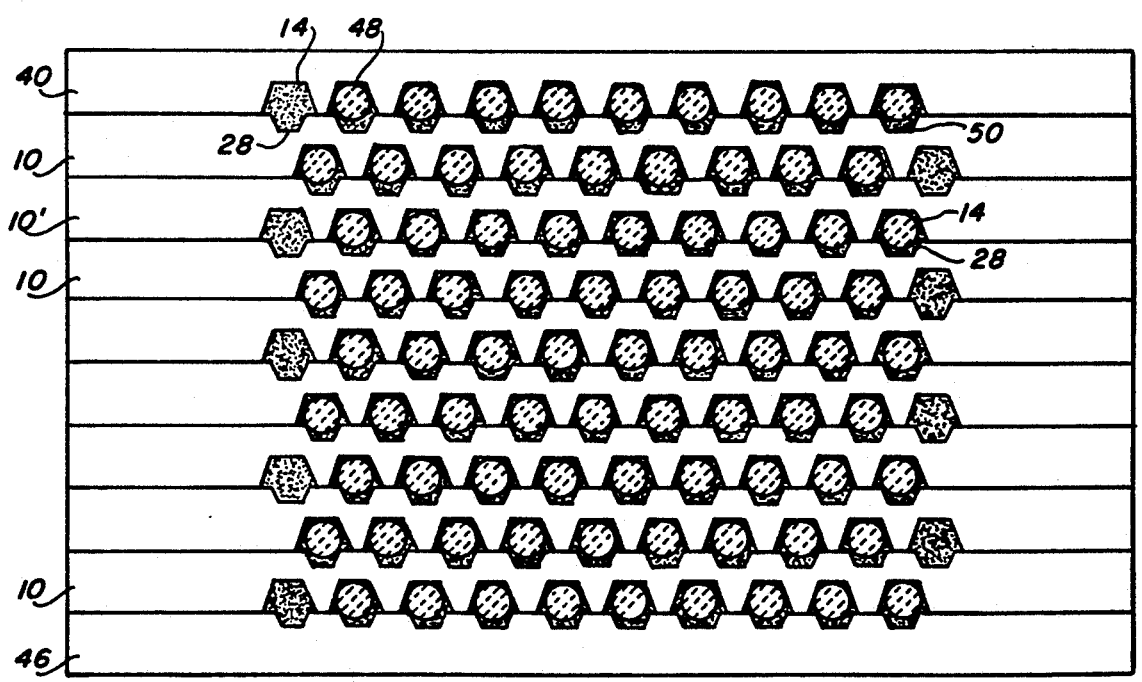
FIG. 3 is a cross-sectional view of the preferred piezocomposite transducer component in an assembled condition.

FIG. 3 illustrates the preferred transducer component in assembled condition showing top preform 40 and a plurality of intermediate preforms 10, 10' stacked on top of bottom preform 46 with transducer rods 48 disposed in cavities formed by upper grooves 14 in a lower preform cooperating with lower grooves 28 in an upper preform. Preform 46 is the bottom preform. Soft resin 50 is disposed in the cavities around the transducer rods.

Figure 4:
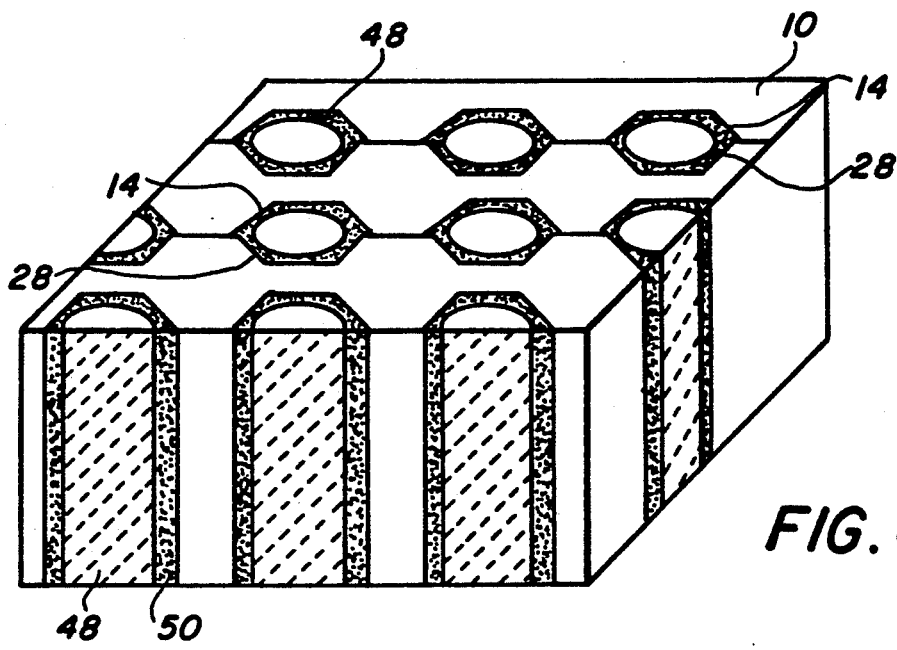
FIG. 4 is a perspective view of a section showing several transducer rods circumferentially embedded in a soft resin, all disposed in a rigid resin matrix formed by the preforms.

FIG. 4 is a perspective view of a section of a transducer of this invention showing transducer rods 48 disposed in cavities formed by upper grooves 14 in a lower preform cooperating with grooves 28 in a preform. Soft resin 50 is disposed in the cavities around the transducer rods.

The present invention also includes a novel method of assembling a transducer. Transducer rods are loaded into a hopper having an inclined surface and an exit at the lower extremity thereof so that the rods are aligned in one direction. A preform is positioned beneath the hopper so that the upper grooves thereof are disposed below the hopper exit and are aligned in the same direction as the rods. The rods are conveyed along at least one inclined surface of the hopper towards the hopper exit, and the preform and hopper are moved relative to each other. The rods are positioned by gravity in the upper grooves of the preform.

Figure 6:
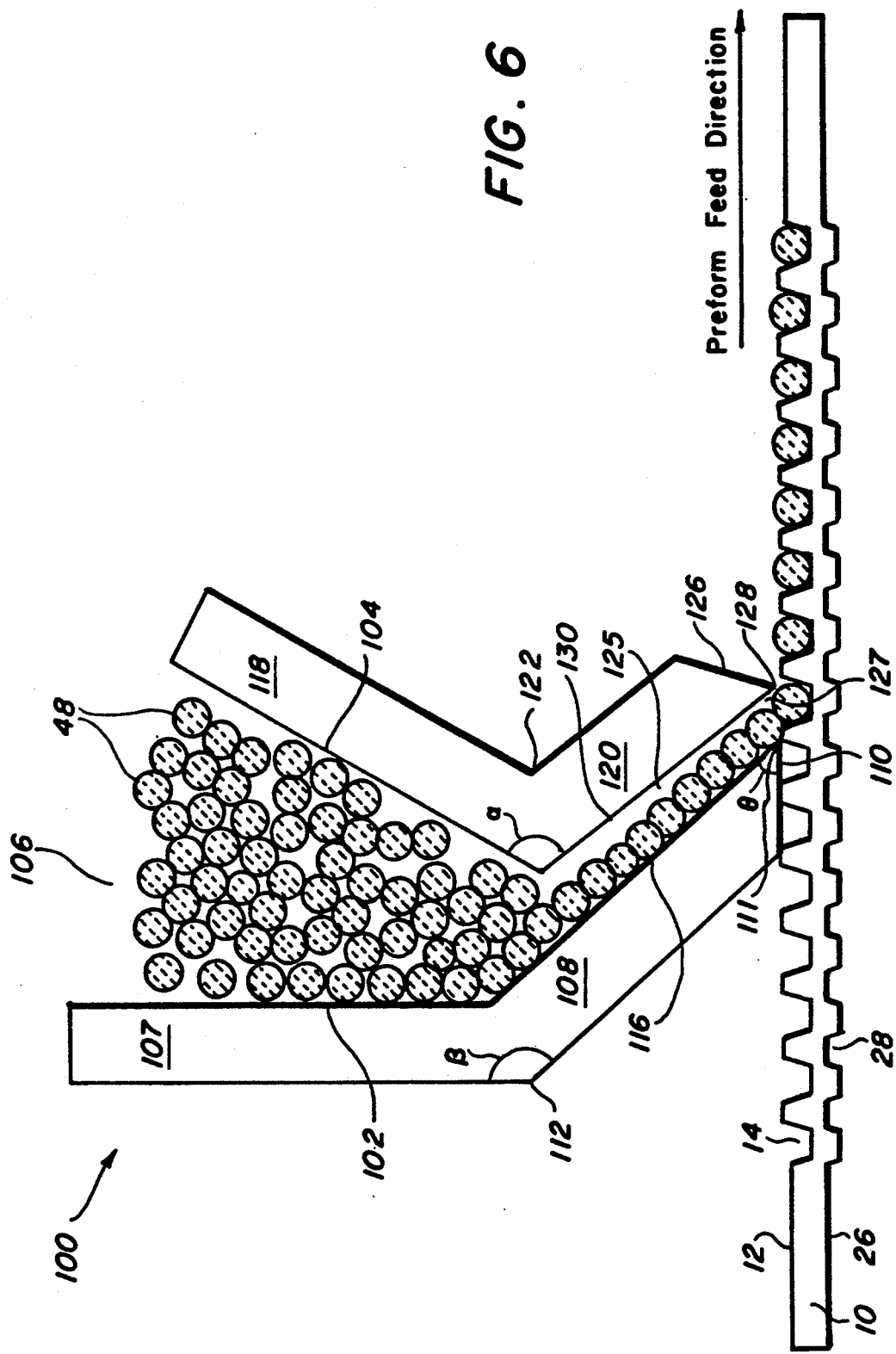
FIG. 6 is a schematic illustration of the assembly procedure of this invention whereby transducer rods are automatically deposited into grooves of a transducer preform.

Referring now to FIG. 6, hopper 100 is composed of spaced sidewalls 102, 104 and end walls (not shown) which form compartment 106 where transducer rods 48 are disposed parallel to each other between sidewalls 102, 104 and the endwalls. The thickness of sidewalls 102, 104 can be varied to suit design or other requirements. The upper leg 107 of sidewall 102 is nearly vertically disposed and is joined to the lower leg 108 which terminates in a horizontal lip 110 having tip 111. The angle $\theta$, between lower leg 108 of sidewall 102 and the horizontal plane of the preform, is typically less than about 90°, and particularly in the range of about 20° to about 70°, in order to create an inclined surface for the rods. Leg 107 and leg 108 of sidewall 102 join at an angle $\beta$. Angle $\beta$ is preferably obtuse, to permit the hopper to include a larger number of transducer rods. Leg 108 includes smooth downwardly inclined inner support surface 116 on which transducer rods 48 roll downwardly by gravity.

Sidewall 104 is also composed of upper leg 118 and lower leg 120 which join at angle $\alpha$, which may range from obtuse to acute, depending on the volume of hopper 100 desired, but is preferably acute. Although lower legs 108, 120 are shown in FIG. 6 as being of a constant thickness, the thickness of these members is not critical and can be varied to suit design or other requirements. Lower leg 120 terminates with lip 126 having tip 128 which is located at the intersection of surface 13 and lip 126, along the plane defined by lip 110.

Transducer rods 48 are disposed in hopper 100 between endwalls, not shown, and sidewalls 102, 104. The rods are disposed in the hopper in such a way that they are generally parallel to sidewalls 102,104. In order to increase the volume of compartment 106 of hopper 100, leg 107 can be made even more divergent than shown in FIG. 6. Although leg 107 is shown in FIG. 6 as nearly vertically disposed, it can be designed to extend further to the left so that angle $\beta$ is even more obtuse than shown. The size of compartment 106 can also be increased by having leg 118 extend to the right so that angle $\alpha$ is reduced.

Leg 120 includes inclined inner surface 130 which is spaced from inner surface 116 of leg 108 by a distance greater than the diameter of one rod 48 but less than the diameter of two rods so that transducer rods 48 travel through passage 125 formed therebetween. Surfaces 116 and 130 are essentially parallel to each other and are spaced sufficiently to permit one rod to easily move along surface 116.

Preform 10 is disposed directly below hopper 100. Tip 111 and tip 128 of hopper 100 are positioned directly above preform 10 so that they glide over the flat upper surface 12 of preform 10. Typically tips 111 and 128 of hopper 100 are disposed over upper surface 12 of preform 10 at a distance of less than diameter of a rod down to where at least one of the tips 111 and 128 are in sliding contact with the upper surface of the preform or disposed just thereabove. Preferably, tips 111 and 128 are spaced from the upper surface of the preform a distance in the range of about 0.01–0.5 cm, especially less than one half the rod diameter.

The preform 10 should remain sufficiently level to prevent the transducer rods from rolling out of the upper grooves. Generally speaking, the most practical disposition of the preform is horizonal, as shown in FIG. 6. In any event, as stated above, lip 110 should be essentially parallel to upper surface 12 of preform 10.

To load the preforms with transducer rods, each empty preform is moved relative to the loaded hopper. Either the preform or the hopper may be moved. Preferably, in the arrangement shown in FIG. 6, the hopper remains stationary and the preform moves from left to right. After loading the transducer rods into the hopper, the hopper is vibrated. This vibration facilitates movement of the rods downwardly to the inclined support surface 116. The rods then travel down passage 125 in a single file. As the preform is moved from left to right, a single rod is automatically deposited in each of the upper grooves of the preform. To load another preform with rods, another preform is positioned in abutting relation behind the preform which is loaded. When lip 110 encounters upper surface 12 of a preform, exit 127 is blocked by the upper surface of that preform. It is only when the exit encounters an upper groove that a rod drops therein. Thus, a plurality of preforms may be properly loaded with transducer rods.

After a plurality of preforms are loaded with transducer rods 48, the loaded preforms are assembled into a transducer element shown in FIG. 3 but devoid of soft resin 50. As shown in FIGS. 2 and 3, top preform 40, loaded bottom preform 46 and intermediate loaded preforms 10 and 10' are assembled by stacking the preforms one on top of another with no spacing therebetween. Upper grooves 14 and lower grooves 28 are disposed one above the other in a cooperating relationship to form cavities.

There are a number of different procedures of providing the soft resin in the cavities around the transducer rods. Pursuant to one procedure, a loaded preform assembly is placed in a chamber with the soft resin in a separate receptacle while the chamber is heated and evacuated. The loaded preform assembly is oriented in the chamber so that the transducer rods are essentially vertical. Heating to an elevated temperature, typically 50°–100° C., depending on the composition of the resin and the preform and transducer rod materials, and evacuation to less than 1 mm of mercury, preferably from about $10^{-6}$ to $10^{-3}$ Torr, is accomplished in a period of time of about 2–15 minutes. The evacuation step removes air from the cavities as well as from the soft resin.

After the heating and evacuation steps, with the preform assembly still disposed in the chamber and with the rods still disposed in the vertical plane, the soft resin is deposited over the preform assembly in a way that the resin flows into the cavities around the rods. The resin flows downwardly around the rods and in most cases spaces the rods from the contact points in the grooves. Resin flow around the rods can be facilitated when the heated resin is thinner and thus flows easier, and because air has been removed from the cavities. The cavities can be completely or partially filled with the soft resin. Once the soft resin is deposited in the cavities around the rods, the soft resin may be cured at an elevated temperature which will not damage the preforms or the rods. Curing can be accomplished by any suitable means. For example, the preform assembly with the uncured soft resin around the rods may be heated in an oven. Typically, the soft resin can be cured to a soft, solid state at a temperature of about 70° to 150° C. in a period of about 1 to about 3 hours. Of course, any ashesive used to bind the stacked preforms together should be capable of withstanding these temperatures. Mechanical means can also be used to bind the stacked preforms, as by means of mechanical fixtures.

Having described the invention, the following examples are given as a particular embodiment thereof and to demonstrate the practice and advantages thereof. It is understood that the example is given by way of illustration and is not intended to limit the specification or the claims in any manner.

EXAMPLE 1

Preforms having the dimendions of those in FIGS. 1–3, were injection molded from a stiff polycarbonate resin having Young's Modulus of 2400 MPa and a Poisson's ratio of 0.39.

Extending from the upper and lower surfaces of the preform there were a total of 10 spaced, equal-sized upper and lower grooves. Side walls of the upper and lower grooves were inclined.

The transducer rods were made of piezoelectric material known as PZT-5H. The sintered rods were loaded into preforms and the preforms were then assembled into a transducer element shown in FIG. 3 but without the soft resin. Some assemblies were held adhesively and other assemblies were held by mechanical means in fixtures.

The transducer element Was then vacuum infiltrated with a soft epoxy resin (RHO-C 35065) having Young's Modulus of 1.4 MPa and Poisson's ratio of 0.49. The finished transducer element corresponded to the one whose cross-section is shown in FIG. 3 and consisted there of one top preform, one bottom preform and 8 intermediate preforms. The intermediate preforms were assembled by turning the alternate preforms 180° so that alternate preforms had long and short edges, starting with a long edged intermediate preform. The preforms with long and short edges refers to the preforms which have the long (x) or short (y) edges measured from the edge along the upper surface of the preform to the first upper groove.

The transducer element made as described above and corresponded to the one shown in FIG. 3. It was composed of, on a volume percent basis, 17% PZT rod material, 30% soft epoxy resin and 53% polycarbonate preforms. Electrodes were then applied over the ends of the rods and over the intervening surfaces of the resin matrix to simulateneously interconnect all the rod ends on one surface and all the rod ends on the opposite surface. External leads can be connected to these electrodes. The transducer element had $d_h$ of 135 pC/N.

EXAMPLE 2

The transducer rods and the preforms used in this example were the same as described in Example 1, above. Loading of the transducer rods into the grooves of the preforms was done by moving the preforms relative to the hopper, pursuant to the arrangement shown in FIG. 6. Legs 107, 108 of sidewall 102 were 2 mm in uniform thickness as were legs 118, 120 of sidewall 104. Angle $\beta$ between upper leg 107 and lower leg 108 was 135°. Upper leg 107 was 5 cm in length and length of lower leg 108 was 1 cm. Angle $\theta$ was 45°. The angle $\alpha$ between upper leg 118 and lower leg 120 of sidewall 104 was 100°. The length of upper leg 118 was 5 cm and the length of lower leg 120 was 0.6 cm. The space between surfaces 116 and 130 was 1.2 cm. Lip 110 was in contact with top surface of the preforms during the loading procedure. The loaded preforms were then assembled into a transducer element shown in FIG. 3 but without the soft resin.

While presently preferred embodiments have been shown of the invention disclosed herein, persons skilled in this art will readily appreciate that various additional changes and modifications may be made without departing from the spirit of the invention as defined and differentiated by the following claims.

What is claimed is:

1. A transducer comprising preforms, rods and soft resin wherein said preforms are vertically stacked and have top and bottom surfaces, said vertically stacked preforms being made of a stiff resin and having a plurality of horizontally spaced upper grooves in said top surfaces thereof; said rods are disposed in said grooves; and said soft resin coating said rods and at least partially filling said grooves.

2. The transducer of claim 1 including a plurality horizontally spaced lower grooves in said bottom surfaces, said lower grooves communicating with said upper grooves in adjoining preforms; and said soft resin also at least partially filling said lower grooves.

3. The transducer of claim 2 wherein said preforms are made of an electrically nonconducting synthetic resin; said rods are made of a piezoelectric material; said soft resin is an electrically nonconducting synthetic thermoplastic resin; said preforms are horizontally elongated along an axis transverse to said upper and lower grooves; said upper and lower grooves comprise inclined side walls; and said lower grooves are shallower than said upper grooves.

4. A transducer comprising preforms, rods and soft resin; said preforms are vertically stacked, have a top surface and a bottom surface and are made of an electrically nonconducting synthetic resin having a modulus of elasticity of from about 300 MPa to about 50,000 MPa; each of said preforms has about 2-500 upper and 2-500 lower grooves, with said lower grooves being shallower than said upper grooves and with said lower grooves communicating with said upper grooves in adjoining preforms; said preforms are horizontally elongated along an axis transverse to said upper and said lower grooves; said upper and said lower grooves are parallel to and equidistantly spaced from each other and have inclined side walls; said upper grooves have an opening width of from about 0.01 cm to about 2 cm, a base width of from about 0.005 cm to about 1 cm, and a depth of from about 0.005 cm to about 1 cm; and said lower grooves have an opening width of from about 0.01 cm to about 2 cm, a base width of from about 0.001 cm to about 1 cm, and a depth of from about 0.001 to about 0.05 cm;

said rods are made of a piezoelectric material and are disposed in said upper grooves; and said soft resin has a modulus of elasticity of from about 0.1 to about 300 MPa, coats said rods and at least partially fills said upper and said lower grooves.

5. The transducer of claim 4 wherein said preform resin has a modulus of elasticity in the approximate range of 500–20,000 MPa; said opening width of said upper grooves is in the approximate range of 0.02–1 cm; said base width of said upper grooves is in the approximate range of 0.01–0.5 cm; said depth of said upper grooves is in the approximate range of 0.01–0.5 cm; said opening width of said lower grooves is in the approximate range of 0.02–1 cm; said base width of said lower grooves is in the approximate range of 0.01–0.5 cm; said depth of said lower grooves is in the approximate range of 0.01–0.2 cm; and said number of said preforms in said transducer is about 3–500.

6. The transducer of claim 5 comprising about 5–30 volume percent piezoelectric material and about 5–75 volume percent of said soft resin, with the remainder being said stiff resin.

7. The transducer of claim 5 comprising about 10–20 volume percent piezoelectric material, about 10–70 volume percent of said soft resin having a modulus of elasticity in the approximate range of 0.5–10 MPa, with the remainder being said stiff resin, said stiff resin having a modulus of elasticity in the approximate range of 500–20,000 MPa; said rods having a diameter in the approximate range of 0.01–05 cm; the number of said preforms being in the approximate range of 5–100; the longitudinal extent of said rods corresponding to the length of said preforms; the number of said upper grooves in each of said preform being in the approximate range of 5–100; the number of said lower grooves in each of said preforms being in the approximate range of 5–100; and the number of said preforms being in the approximate range of 5–100.

8. The transducer of claim 7 wherein said rods are made from lead-zirconium-titanate; said preforms are made from polycarbonate resin; said soft resin is epoxy; and said transducer has a hydrostatic charge coefficient $d_h$ in the approximate range of 100 to 150.

* * * * *